United States Patent [19]

Amboss

[11] 4,227,090
[45] Oct. 7, 1980

[54] ELECTRON BEAM MICROFABRICATION APPARATUS AND METHOD

[75] Inventor: Kurt Amboss, Pacific Palisades, Calif.

[73] Assignee: Hughes Aircraft Company, Culver City, Calif.

[21] Appl. No.: 13,588

[22] Filed: Feb. 21, 1979

[51] Int. Cl.³ .................. A61K 27/02; B01J 1/10; G01N 23/00
[52] U.S. Cl. .................. 250/492 A; 250/310; 250/492 R
[58] Field of Search ........... 250/492 A, 492 R, 492 B, 250/310

[56] References Cited

U.S. PATENT DOCUMENTS

| 3,551,734 | 12/1970 | O'Keeffe | 250/492 A |
| 4,039,810 | 8/1977 | Heritage | 250/492 A |
| 4,145,615 | 3/1979 | Sumi | 250/492 A |

*Primary Examiner*—Harold A. Dixon
*Attorney, Agent, or Firm*—Allen A. Dicke, Jr.; W. H. MacAllister

[57] ABSTRACT

Electron beam microfabrication apparatus has spherically concave photocathode pattern 40 which when excited produces patterned electron beam 48 which is accelerated by electrode 44 and magnetically focused by magnet 58 to impinge as a demagnified patterned field 60 on a photoresist carrying semiconductor wafer 36 mounted of wafer holder 34.

11 Claims, 2 Drawing Figures

ELECTRON BEAM MICROFABRICATION APPARATUS AND METHOD

BACKGROUND OF THE INVENTION

This invention is directed to an electron beam microfabrication apparatus and method wherein a curved photocathode is part of a demagnifying electron optical system. When the photocathode is excited through a mask pattern the resultant electrons are demagnified and focused onto a wafer.

The prior art includes electron projection from a photocathode. A typical cathode projection microfabrication system reproduces patterns with about a 0.6 μm line width at 1:1 magnification onto a silicon wafer. The required pattern is defined in a mask on a flat quartz substrate and a photocathode is evaporated on top. The mask is illuminated from behind with ultraviolet light so that electrons are emitted from the clear mask areas but not from the dark areas. The photoelectrons are accelerated by a high uniform electric field onto the silicon slice which is held opposite. The photoelectrons are focussed by a uniform magnetic field parallel to the axis of the mask and wafer. This electron imaging technique is disclosed in W. R. Livesay, "Integrated Circuit Production with Electron Beams," J. Vac. Sci. Technol., 10, 1028-32 (Nov./Dec. 1973); J. E. Piquendar, "Nanoelectronics," Proc. Fifth Int'l Conf. on Electron and Ion Beam Science and Technology, (May 1972, Houston) Electrochemical Society, Princeton, N.J., 1972, p. 31; and J. P. Scott, "An Electron Image Projector with Automatic Alignment," IEEE Trans. on Electron Devices, ED-22, 409-13 (July 1975).

Unfortunately the practical embodiment of such a system poses problems for submicron lithography. The problems which arise include the fact that the pattern printed on the photomask must exceed the accuracy of the pattern which will be produced on the wafer, to ensure reproducibility. Another problem is the distortion of the accelerating electric field which is produced by the wafer holder, and this distortion distorts the projection. Furthermore, electrostatic charging of dust particles on the wafer, and charging of the resist both introduce factors which result in non-repeatable image distortion. Wafer bowing is another effect which produces pattern distortion. The deviation from flatness of the photocathode produces pattern distortion similar to wafer bowing. However, since the electrons move very slowly close to the cathode the tolerances on the emitter flatness must be much tighter.

Another problem with the parallel projection system is that the thermal effects of parallel exposure produce a temperature rise of about 6° C. in the wafer with resultant bowing which will lead to blurring of the image point. Another problem of this projection system is that backscattered electrons cannot escape. Electrons which are backscattered from the wafer are emitted into an electric field which drives them back into the semiconductor wafer, thus causing electron impingement where is it not desired. In addition, the electron optics of the parallel projection system do not permit the introduction of an aperture into the system, and hence the resolution is determined by velocity spread of the emitted photoelectrons.

In order to overcome many of the above limitations a ten-to-one demagnifying electron projection system has been built. That system is disclosed in M. B. Heritage, "Electron-Projection Microfabrication System," J. Vac. Sci. Technol., 12, 1135-40 (Nov./Dec. 1975). The mask is a self supporting stencil with a desired pattern cut out so that a flood electron beam may be transmitted through it. The exposed field size is 3 mm × 3 mm and the mask has an area of 30 mm × 30 mm. The minimum linewidth is 0.25 micron and is defined to 0.05 micron. The exposure time for PMMA resist (the conventional modern photoresist material employed in this service) is about 0.1 second for each 3 mm square field.

The stencil is in field free space at final voltage and acts to produce the electron distribution by stopping unwanted electrons.

The problems with the above-described demagnification projection system include the fact that it is an extremely large system and it is therefore subject to perturbation by stray fields. The system is complex and therefore expensive. The self-supporting stencil mask is difficult to manufacture and may pose power dissipation problems. Furthermore, the field coverage is limited to about 3 mm × 3 mm by off axis aberrations. That prior art system includes an electron gun which supplies electrons through a series of electro-optical lenses to provide a broad (30 mm square) flood electron beam with parallel paths. The self-supporting mask is placed in this beam so that some of the electrons are intercepted in accordance with the mask pattern. The electrons which pass are focussed by a first projector lens through an aperture to a second projector lens which directs the patterned electron beam again into a parallel beam with a maximum 3 mm square size onto the wafer. That system is about 152 centimeters long, from the electron gun to the wafer and is positoned in a 40 centimeter diameter tube. This large size makes it subject to perturbations from external fields.

Thus there is need for an electron beam microfabrication apparatus which is an improvement over these prior art devices.

SUMMARY

In order to aid in the understanding of this invention it can be stated in essentially summary form that it is directed to an electron beam microfabrication apparatus and method wherein a photocathode is optically excited in accordance with a mask pattern to emit an electron pattern. Optics demagnify and focus these electrons directly onto a wafer to pattern expose the resist thereon.

Accordingly, it is an object of this invention to provide an electron beam microfabrication apparatus which employs a self-supporting pattern of a multiple of the size which is desired to be imprinted upon a wafer so that pattern preparation is simplified. It is another object to provide an electron beam microfabrication apparatus wherein a curved photocathode is configured in the desired pattern so that electrons therefrom are patterned and are focussed to demagnify the size of the pattern. It is a further object to provide an electron optical system which accurately demagnifies through the use of a curved photocathode. It is a further object to provide an electron beam microfabrication system which is inexpensive, because the structure is small and simple and because demagnification permits a more coarse mask on the photocathode. It is a further object to provide an electron beam microfabrication apparatus wherein refocussing of secondary electrons is eliminated to improve contrast, and the photocathode can be isolated from the wafer for longer cathode life and quicker pumpdown. It is another object to provide an electron beam microfabrication method which employs such a pattern mask in such an apparatus.

Other objects and advantages of this invention will become apparent from a study of the following portion of this specification, the claims and the attached drawings.

DESCRIPTION OF THE PREFERRED EMBODIMENTS

Figure 1:
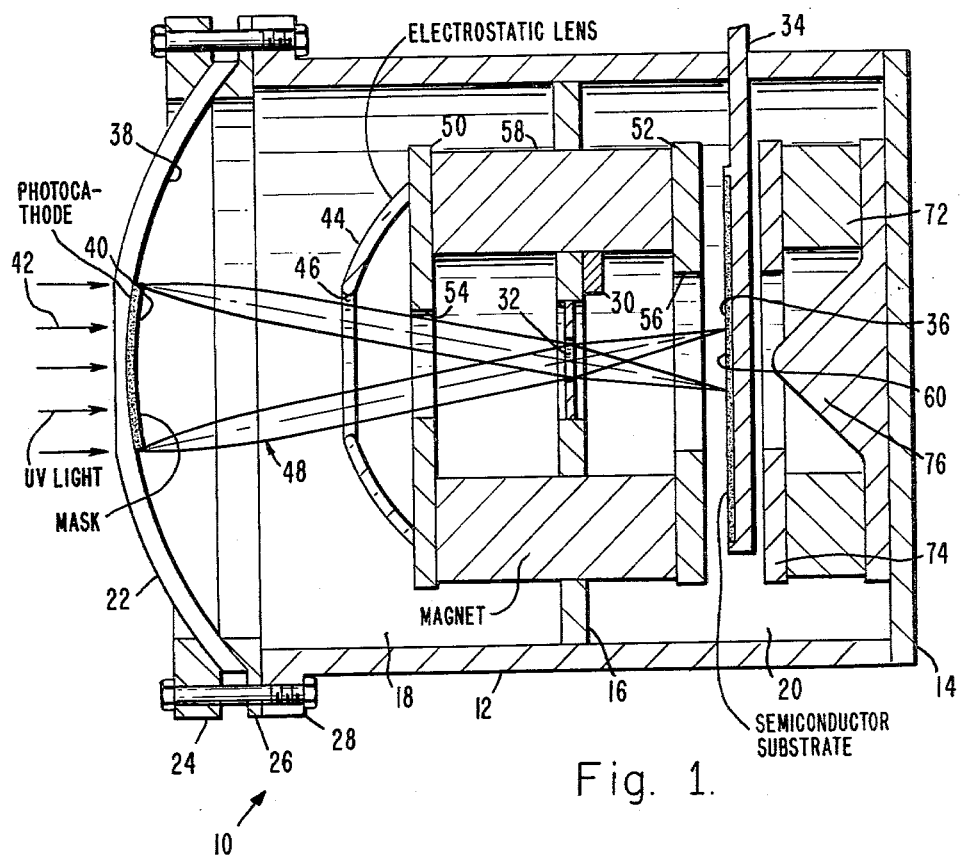
FIG. 1 is a central cross-section through the perferred embodiment of the electron beam microfabrication apparatus in accordance with this invention.

Electron beam microfabrication apparatus 10 is illustrated in longitudinal section in FIG. 1. Housing 12 is a cylindrical housing having a horizontal axis in the plane of the paper in FIG. 1. Housing 12 has a rear cover 14 to close the rear of the housing. It has a central web 16 which divides the interior of the housing into front volume 18 and rear volume 20.

The front of housing 12 is closed by spherical transparent dome 22. In order to permit changes of the spherical dome, it is clamped between flanges 24 and 26, and these flanges are clamped to flange 28 on the main cylindrical portion of housing 12.

Housing 12 is vacuum tight and valve plate 30 is arranged to so that it can swing across focussing aperture 32 to separate the volumes 18 and 20 into separate vacuum spaces.

Wafer holder 34 is for positioning and holding wafer 36 in the desired location. Wafer holder 36 can be manipulated so that the wafer is held in the desired position, and is thenceforth moved into a new desired position. Manipulation can be from an external source or can be from motors controlling the wafer holder stage in rear volume 20. The positioning of the wafer, in order to provide the desired interrelationship between adjacent exposure fields, and the necessary registration between successive exposures of the same field is critical. This wafer registration is accurately accomplished as described below.

Dome 22 has on its spherical inner surface 38 a mask 40 which represents the desired exposure shapes or pattern. In a particular example of the apparatus 10, with a demagnification scale of 10 times, mask 40 is 10 times the size of the desired pattern to be printed on wafer 36. Mask 40 is first formed as a pattern on the surface 38 by photoexposure of a photosensitive masking material, followed by evaporation of lines representing the desired pattern, followed by the evaporation of a photocathode onto the desired lines to produce a configured photocathode in the desired mask pattern shape. Cesium iodide is a suitable photocathode material. The result is a spherically curved photocathode which is a magnified version of the desired mask pattern on the target. Since the apparatus 10 demagnifies the pattern, a more coarse mask is permissible. The interior surface 38 of dome 22 away from patterned photocathode 40 is metal plated and is at cathode potential to act as an electric field defining electrode 38. Furthermore, the spherical shape of the surface 38 on which photocathode 40 is formed is used to compensate the aberration of the curvature of the image field which would be present if the photocathode were flat. This photocathode structure is cheaper than and more rugged then a stencil.

An ultraviolet light source 42 illuminates photocathode mask 40 from the outside of dome 22. Electrons are produced in a pattern in accordance with the lines on photocathode mask 40. Electrostatic spherical condenser lens 44 has an opening 46 therein for the passage of patterned electron beam 48. A power supply applies potential to spherical condenser lens 44 to make it positive with respect to photocathode mask 40 to accelerate the patterned electron beam.

In electron optics an immersion lens system the object, in this structure the photocathode, is in an electric field. The electric field is the medium of varying the (electron optical) refractive index. The immersion system shares with the magnetic lens the task of producing the demagnified image.

Circular disc pole pieces 50 and 52 respectively have lens openings 54 and 56 therethrough. Magnet 58 is in a form of a hollow cylindrical tube which is axially magnetized. Pole pieces 50 and 52 are on the axial ends of magnet 58. This magnetic system focuses electron beam 48 through focussing aperture 32 so that the image of photocathode pattern mask 40 is demagnified and focussed on the exposure field 60. Ring magnet 72 with its perforated circular disc pole piece 74 and shaped pole piece 76 aid in minimizing aberrations in the magnetic field lines to obtain focussing an exposure field 60. An exposure field of 4 millimeters square is practical. In a three inch (77 mm) round wafer, the useful total field consists approximately of the inscribed square which has a side of 54 millimeters. This square contains 324 three millimeter square fields or 182 four millimeter fields. When the time required to align the individual fields is considered, which is in the order of two seconds, it is seen that the processing time for the whole wafer runs into minutes, with the exposure time of the photoresist contributing only a small fraction of the time. An example of a suitable photoresist is PPMA with a sensitivity of $1 \times 10^{-5}$ coulombs/cm$^2$ with a resolution of 0.1 microns, an exposure time of 2.0 seconds per field is achieved with a photocathode emitting at $4.3 \times 10^{-4}$ A/cm$^2$. This results in a wafer processing time of 720 seconds for the above-described wafer with 4 millimeter square fields.

Figure 2:
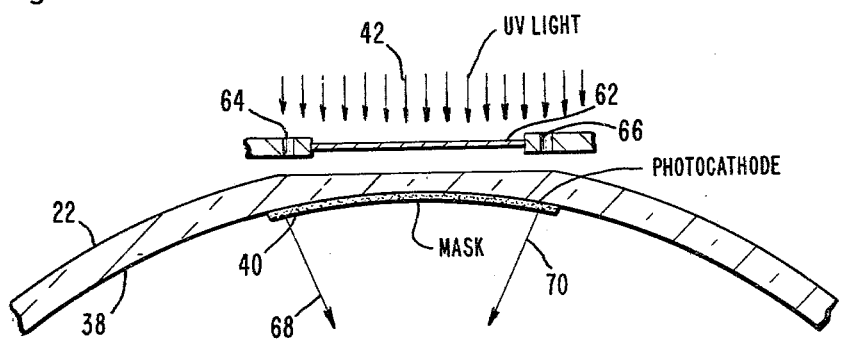
FIG. 2 is an enlarged section through the photocathode thereof, with parts taken in section and parts being broken away.

The alignment of the wafer as it is moved from one field exposure to the next is achieved by providing an alignment pattern at the four corners of the photocathode. During alignment, a mask 62, see FIG. 2, is moved into place. Mask 62 has openings 64 and 66 at the corners of the photocathode 40 to allow illumination only of the alignment pattern marks at the corners of the photocathode. This produces electron streams 68 and 70 from the photocathode alignment marks. These electron beams fall on corresponding alignment marks on the wafer. Connections to the alignment marks produce suitable error signals by which correction in positioning of wafer holder 34 is made. Reduction in the focussing aperture 32 increases the accuracy of registration.

Thus, the apparatus 10 is used in the method whereby sequential exposure of sequential fields are made on a wafer. The method employs a curved photocathode which emits electrons in a pattern determined by the photocathode mask pattern. This photocathode is part of the demagnifying electron optical system to provide a system which is compact and thus inexpensive. Furthermore, demagnification in the optics allows the use of a coarser pattern mask in the photocathode. In the absence of an electric field applied to the wafer, refocusing of secondary electrons is eliminated to increase exposure contrast. The photocathode can be mechanically isolated from the wafer by closure of the valve plate 30 across focusing aperture 32 to provide for a longer cathode life and quicker pumpdown of the rear volume 20 when the wafer is exchanged. The photocathode curvature eliminates aberrations. Furthermore, the use of a photocathode is less expensive and more rugged than the use of a stencil.

The absence of an electric field of the wafer allows backscattered electrons to escape so that contrast is not degraded.

This invention having been described in its preferred embodiment, it is clear that it is suseptible to numerous modifications and embodiments within the ability of those skilled in the art and without the exercise of the inventive faculty. Accordingly, the scope of this invention is defined by the scope of the following claims.

What is claimed is:

1. An electron beam microfabrication apparatus comprising:
   a substantially spherically curved female surface for receiving thereon a patterned photocathode;
   a semiconductor wafer holder positioned in front of said surface; and
   a lens for focusing electrons emitted from said patterned photocathode onto a wafer on said wafer holder on a demagnification scale so that when said photocathode is excited the patterned electron emission therefrom is focussed and demagnified and projected onto a resist on a wafer on said wafer holder for exposure thereon of a demagnified pattern.

2. The electron beam microfabrication apparatus of claim 1 wherein said substantially spherically curved surface is on the interior of a dome which is at least partly transparent so that energization of said photocathode is by light projected through said dome.

3. The electron beam microfabrication apparatus of claim 2 wherein a substantially spherical condenser lens electrode is positioned between said photocathode and wafer holder, said lens electrode being for having a positive potential applied thereto with respect to said photocathode to accelerate and demagnify the patterned electron beam.

4. The electron beam microfabrication apparatus of claim 2 wherein lens is a said magnetic focussing lens has first and second pole pieces between which said electron beam is projected.

5. The electron beam microfabrication apparatus of claim 4 wherein a substantially spherical condenser lens electrode is positioned between said photocathode and said first magnetic lens pole piece, said lens electrode being for having a positive potential applied thereto with respect to said photocathode to accelerate and demagnify the patterned electron beam.

6. The electron beam microfabrication apparatus of claim 5 wherein said photocathode dome forms one end of an enclosure, and there is a central web through said enclosure to separate said enclosure into a front volume and a rear volume, with said photocathode in said front volume and said wafer holder in said rear volume so that said wafer holder can be removed without pressurizing said front volume.

7. The electron beam microfabrication apparatus of claim 1 wherein said photocathoe dome forms one end of an enclosure, and there is a central web through said enclosure to separate said enclosure into a front volume and a rear volume, with said photocathode in said front volume and said wafer holder in said rear volume so that said wafer holder can be removed without pressurizing said front volume.

8. The electron beam microfabrication apparatus of claim 7 wherein said web is placed at a focal point of the patterned electron beam and there is a focusing aperture through said web and there is a valve plate positionable across said focusing apertures so that said focusing aperture can be closed.

9. The electron beam microfabrication apparatus of claim 1 wherein said photocathode has registration marks on the corner thereof and there is a registration mask positionable to cover substantially all of said photocathode from energization, but to permit energization of said alignment marks so that said wafer holder can be moved to place particular locations on said wafer holder under the electron beam projected from said alignment marks.

10. The method of exposing material supported on a wafer holder comprising the steps of:
    forming a substantially spherically female curved photocathode mask pattern;
    exciting the photocathode to produced an electron beam patterned in accordance with the photocathode mask pattern;
    accelerating, focusing, and demagnifying the electron beam with its mask pattern; and
    positioning material in front of the electron beam to be pattern exposed on a reduced scale.

11. The method of electron beam microfabrication of claim 10 wherein the accelerating and demagnifying is accomplished by a curved accelerating electrode and the focusing is accomplished by a magnetic focusing and demagnifying magnetic fields.

* * * * *